United States Patent [19]

Takahashi et al.

[11] Patent Number: 4,982,095
[45] Date of Patent: Jan. 1, 1991

[54] MULTI-ELEMENT TYPE RADIATION DETECTOR

[75] Inventors: Tetsuhiko Takahashi, Suginami; Hirosh Takeuch, Matsudo; Toshikazu Shimada, Kokubunji; Haruo Itoh, Hino; Tadaaki Hirai, Koganei; Kenji Maio, Sugniami; Kenichi Okajima, Houya; Minoru Yoshida, Nishitama; Hideaki Yamamoto, Tokorozawa, all of Japan

[73] Assignee: Hitachi, Ltd., Tokyo, Japan

[21] Appl. No.: 239,387

[22] Filed: Sep. 1, 1988

[30] Foreign Application Priority Data

Sep. 4, 1987 [JP] Japan ............................ 62-220115
Sep. 21, 1987 [JP] Japan ............................ 62-234805

[51] Int. Cl.$^5$ ............................................. G01T 1/20
[52] U.S. Cl. ................................. 250/367; 250/366; 250/370.11
[58] Field of Search ................ 250/370.11, 367, 366

[56] References Cited

U.S. PATENT DOCUMENTS

| 4,731,534 | 3/1988 | Klein et al. | 250/366 |
| 4,733,088 | 3/1988 | Yamada et al. | 250/483.1 |
| 4,845,363 | 7/1989 | Akai | 250/368 |

FOREIGN PATENT DOCUMENTS

| 57-172273 | 10/1982 | Japan | 250/370.11 |
| 2167279 | 5/1986 | United Kingdom | 250/370.11 |

Primary Examiner—Constantine Hannaher
Attorney, Agent, or Firm—Antonelli, Terry, Stout & Kraus

[57] ABSTRACT

This invention relates to a multi-element type radiation detector for an X-ray CT scanner system wherein a plurality of scintillator blocks that are isolated either optically or radiation-wise from one another are arranged integrally, and a photo-diode consisting of an amorphous silicon layer for converting the emission of each scintillator is formed on the surface of each scintillator block by thin film technique.

3 Claims, 6 Drawing Sheets

MULTI-ELEMENT TYPE RADIATION DETECTOR

BACKGROUND OF THE INVENTION

This invention relates to a radiation detector used for an X-ray CT scanner system, and more particularly to a multi-element type radiation detector which has less variation of detection sensitivity due to the position of incidence of radiation and variance of sensitivity between individual elements but has high detection sensitivity.

A large number (e.g. 512 ch.) of elements are used in the X-ray CT scanner system. If sensitivity variance exists between these elements, round artifact develops on a reproduced image. Accordingly, uniformity of sensitivity between the elements is of utmost importance. Sensitivity distribution inside each element is also an important factor which determines discrimination capacity or resolution on the image.

As an example of radiation detectors for such an X-ray CT scanner system, Japanese Patent Laid-Open No. 24174/1987 discloses a structure wherein silicon photo-diodes are bonded by a bonding material on the surface of a scintillator opposite to the surface of incidence of X-rays. However, the X-ray detector using the bonding material involves the following problems:

1. A position error occurs between the scintillator and the photo-diode when they are bonded, and sensitivity variance inside the element occurs, too.
2. High level of skill and labor are necessary in order to bond precisely the scintillator and the photo-diode for a large number of elements.
3. An extremely high level of technique is necessary to arrange a large number of elements in intimate contact with one another and with high position accuracy.

On the other hand, Japanese Patent Laid-Open No. 71881/1987 discloses a structure wherein an amorphous silicon layer is formed on the surface of the scintillator and is used to form photo-diodes, in place of coupling of the scintillator and the photo-diode by use of the bonding material. According to this structure, an optical coupling state between the scintillator and the photo-diode is extremely stable and sensitivity variance resulting from the bonding material decreases. However, since this prior art technique fabricates a multi-element X-ray detector for an X-ray CT scanner system by arranging a large number of laminate structures each consisting of the scintillator and the photo-diode and being formed individually, a great deal of labor is necessary for accurately arranging a large number of elements. Furthermore, a signal line must be wired to each element so that an extremely high cost is necessary for apparatuses in order to prevent all of these wirings from generating noise due to mechanical vibration.

SUMMARY OF THE INVENTION

It is therefore an object of the present invention to provide a multi-element type radiation detector which minimizes sensitivity variance between elements and moreover, which can be fabricated and packaged easily.

It is another object of the present invention to provide a multi-element type radiation detector which reduces the number of necessary components and has less noise due to mechanical vibration.

One of the characterizing structures of the present invention resides in that a plurality of photo-diodes made of an amorphous photoconductive material and isolated electrically from one another are arranged on the surface of a scintillator. A laminate structure of these photo-diodes and the scintillator forms one detector block and a plurality of detector blocks are arranged and are used for an X-ray CT scanner system.

Another characterizing feature of the present invention resides in that a support is bonded further to the surface of each laminate structure on which a plurality of photo-diodes are formed, the scintillator is cut at the positions corresponding to the isolation positions of the photo-diodes and a separator layer made of a material, which is opaque either optically or radiation-wise, is disposed in each of the grooves formed by this cutting.

Still another characterizing feature of the present invention resides in that a plurality of switch elements made of an amorphous semiconductor material are formed on the surface of the scintillator in addition to a plurality of photo-diodes described above. These switch elements are operated as a multiplexor which supplies sequentially the detection signal of each photo-diode to one output terminal. Therefore, since the output signal lines from a plurality of elements can be picked out from one terminal, the number of wirings of a signal system can be reduced, the signal lines can be made rigid and strong and eventually, the cost of production of the system can be reduced as a whole.

DESCRIPTION OF THE PREFERRED EMBODIMENTS

Figure 1:
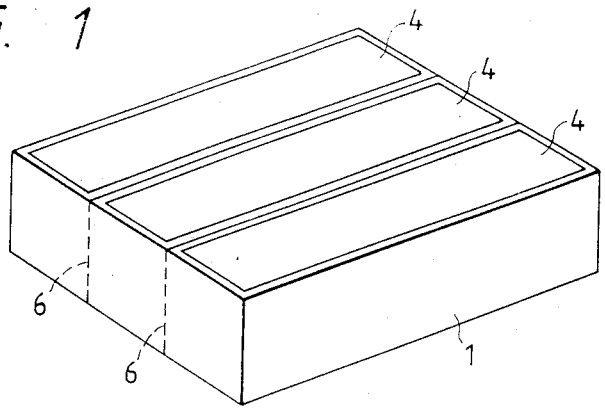
FIGS. 1 and 2 are a perspective view and a sectional view showing one embodiment of the present invention.

Hereinafter, the structure of one embodiment of the present invention will be described with reference to FIG. 1. A scintillator 1 consists of a $Gd_2O_2S$:Pr, Ce, F block formed by hot isostatic press, for example, and its surface is mirror-polished. The scintillator block formed by hot isostatic press of $Gd_2O_2S$: Pr, Ce, F is stable both thermally and chemically and is suitable as a substrate for forming a-Si photo-diodes.

On one surface of this scintillator are formed a plurality of a-Si photo-diodes 4 while being isolated from one another. The drawing shows an example where three elements are formed on one scintillator. Each element is 30 mm long and 1.2 mm wide, and the element gap is 300 $\mu$m, for example. The scintillator is 1.5 mm thick, for example. The scintillator is preferably thick enough to sufficiently absorb the radiation rays to be detected. The thin film-like photo-diodes are shown in detail in the sectional view of FIG. 2.

A 0.5 $\mu$m-thick indium tin oxide (ITO) layer is formed as a transparent conductive film 8 on the mirror-polished surface of the scintillator 1, and then 1 $\mu$m- thick amorphous silicon (a-Si) is formed as a photo-conductive film 9. Plasma CVD (Chemical Vapor Deposition) is used for forming the a-Si layer 9. The interface between the ITO layer 8 and the a-Si layer 9 forms a hetero-junction. In other words, they form a hetero-junction diode. A 2 μm-thick NiCr layer 10 and a 1 μm-thick Au layer 11 are formed on the a-Si layer 9 to obtain one of the electrodes. The NiCr layer 10' and the Au layer 11' are formed directly at one of the ends of the ITO layer 8 without forming the a-Si layer. The most of the portions of these Au layers are covered with a protective film 12 consisting of an SiN4 layer. Au lines are connected to the exposed Au layer to transmit signals to the outside. Each of these thin films is formed by ordinary photolithography technique.

Figure 2:
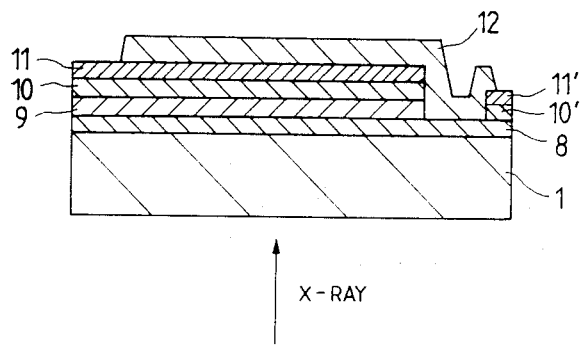
Figure 3A:
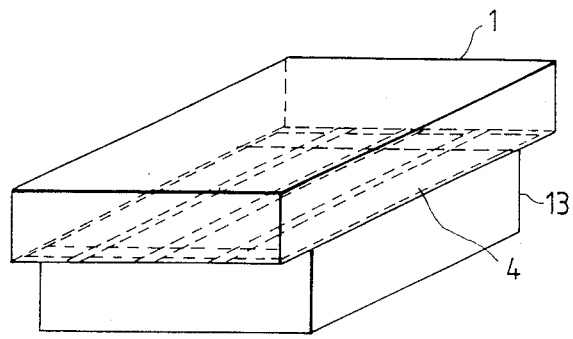
FIGS. 3A, B and C are perspective views showing the fabrication method of FIG. 1.
Figure 3B:
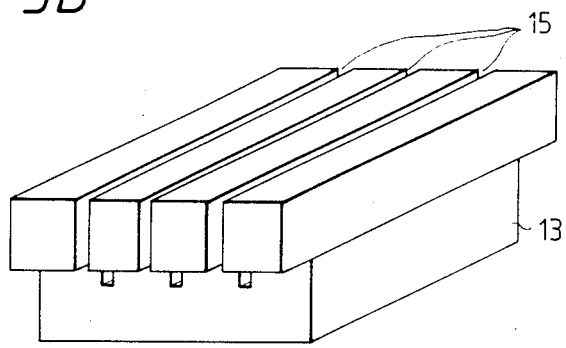

Each scintillator on which the a-Si photo-diodes having the structure described above are formed and isolated from one another must be separated either optically or radiation-wise at the positions represented by reference numeral 6 in FIG. 1 in order to reduce crosstalk between the elements. In this embodiment, the separation between the elements is made by the method shown in FIGS. 3A 3B and 3C. As shown in FIG. 3A, the surface of the scintillator 1 on which the a-Si photo-diodes are formed is bonded to a support 13 by use of a bonding material In other words, the portion of the protective film shown in FIG. 2 is bonded to the support 13.

Figure 3C:
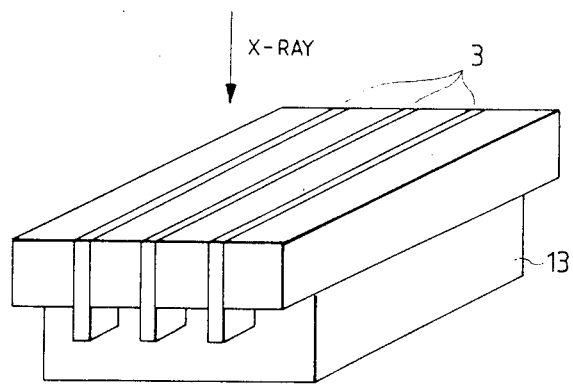

Since the support and the bonding materials are employed merely to fix the scintillator 1, they may be opaque to the X-rays and light After the scintillator block 1 is bonded to the support, trenches 15 having a depth reaching the support 13 are defined between the elements to isolate them. Since the support and each element are bonded at this time, the positions between the elements do not change and the elements having uniform performance can be obtained easily and advantageously. A separator sheet 3 is then inserted into each trench 15 thus defined as shown in FIG. 3C. The separator sheet 3 consists, for example, of a molybdenum sheet on which aluminum (Al) is vacuum-deposited. Since the tip of this separator sheet 3 enters the trench of the support 13, each element is isolated completely both optically and radiation-wise.

In this embodiment, the photoconductive layer 8 consists of a single layer of a-Si and lamination of the ITO layer on the former forms a hetero-junction and obtains a photo-diode. However, it is possible to use an SnO2 film, or the like, as a film for forming a transparent hetero-junction in place of the ITO layer so as to obtain a PIN type, a Schottky type, a diffusion type, an avalanche type or an MIS type photo-diode structure. In such cases, any materials can be used in place of the ITO layer as the lower electrode layer 8 so long as they are a material or have a structure which is transmissive to the rays of light of scintillator. The electrode material and the protective film are not particularly limited to those used in this embodiment, either.

Figure 4:
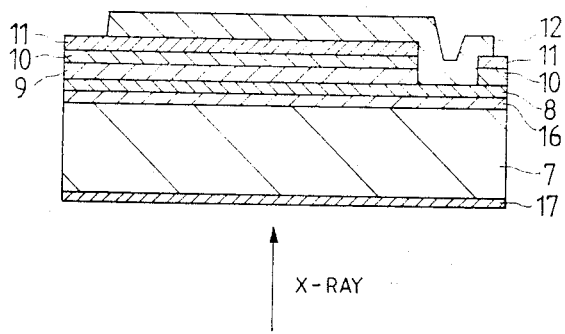
FIGS. 4 and 5A to 5D are a sectional view and perspective views showing other embodiments of the present invention, respectively.

FIG. 4 is a sectional view showing another embodiment of the present invention. In this embodiment, a transmissive protective film 16 is disposed between the transparent conductive film 8 and the scintillator 1. An SiO2 film or SiN4 film may be used as the transmissive protective film, for example, and its thickness may be 1 μm, for example. According to this structure, it is easy to prevent contamination from the scintillator substrate to the a-Si side, and to fully utilize the performance of the a-Si photo-diode. Since the transmissive protective film is disposed, the mirror property of the surface, on which the a-Si photo-diodes are formed, can be improved, and high performance a-Si photodiodes can be fabricated more easily.

In this embodiment, a reflection film 17 is formed on the X-ray incidence surface of the scintillator. If a 0.3 μm-thick Al vacuum deposition film is used as this reflection film, for example, it does not substantially absorb the X-rays of 50 keV, for example, but reflects substantially completely the emitted rays from the scintillator, so that detection sensitivity of the detection element can be improved drastically. Since the rays of light from outside the scintillator can be cut off, too, the film is effective for reducing noise resulting from stray light.

Figure 5A:
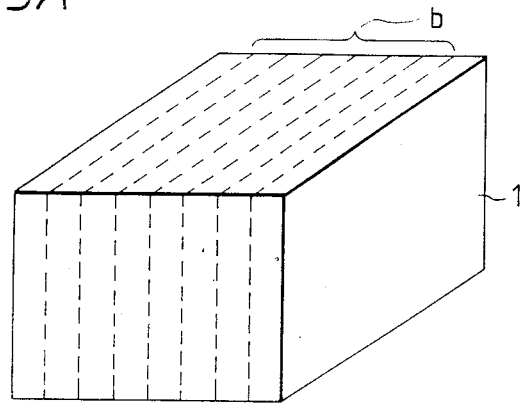
Figure 5B:
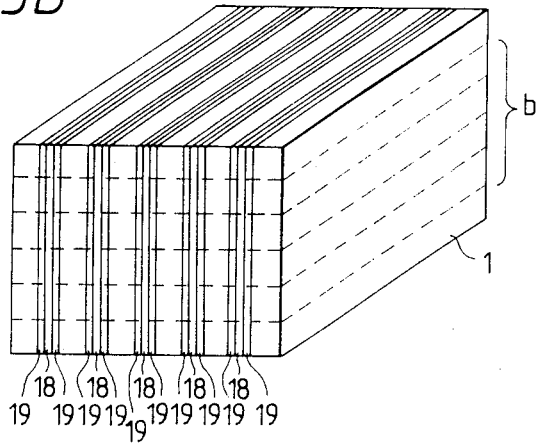

FIGS. 5A to 5D show still another embodiment of the present invention. As shown in FIG. 5A, the block-like scintillator 1 is cut on the cut surfaces 6 represented by dotted lines After each cut surface is mirror-polished, a molybdenum sheet 18 as the separator sheet is fused by low melting glass 19, for example, as shown in FIG. 5B to form a laminate scintillator. Here, the molybdenum sheet 18 is 0.1 mm thick, for example, and aluminum vacuum deposition may be made to both of its surfaces in order to improve its reflectivity.

Next, the laminate scintillator is cut on the cut surfaces 6 represented by dotted lines in FIG. 5B. The cutting width of the scintillator is 1.5 mm, for example. Each cut surface is mirror-polished, and a protective film 16 and a reflection film 17 are disposed on its upper and lower surfaces, respectively. The resulting scintillator is used as the substrate for forming photo-diodes.

Figure 5C:
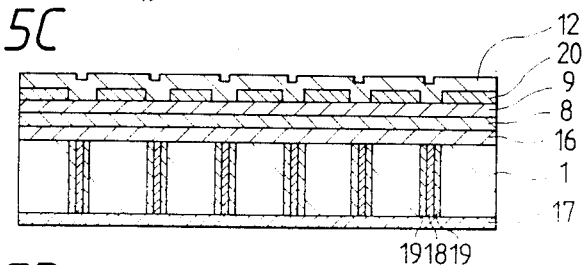
Figure 5D:
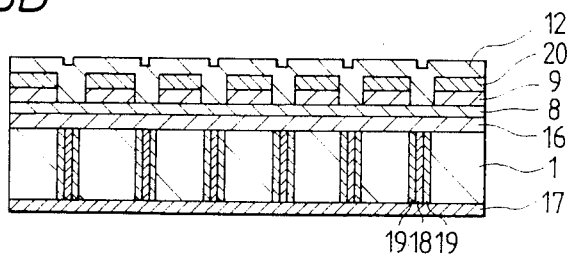

In this embodiment, the scintillator 1 is already separated by the separator sheet 18 as shown in FIGS. 5C and 5D. An ITO layer 8, an a-Si layer 9 and an upper electrode layer 20 for forming the photo-diode are formed at the position corresponding to each scintillator element and finally, a protective film 12 is formed. At this time, fabrication accuracy of the element is determined by accuracy of photolithography and is by far higher than accuracy of mechanical machining. As a result, any position error does not occur between the photo-diode and the scintillator element.

In this embodiment, the transmissive protective film 16 is extremely effective for protecting the substrate. The a-Si film 9 may be used commonly for all the elements as shown in FIG. 5C, or may be formed individually for each element. If the protective film 16 is used in common for all the elements, the photolithography step can be simplified. Since a-Si can be used as the photoconductive layer, signal leakage to the adjacent elements is extremely less due to its high resistance characteristics.

The a-Si layer 9 may be formed for each element as shown in FIG. 5D, and in such a case, the signal leakage described above can be further reduced and signal quality can be improved remarkably. In FIGS. C and 5D, the electrode 20 is separated for each element and the output signal corresponding to each element can be detected.

Figure 6:
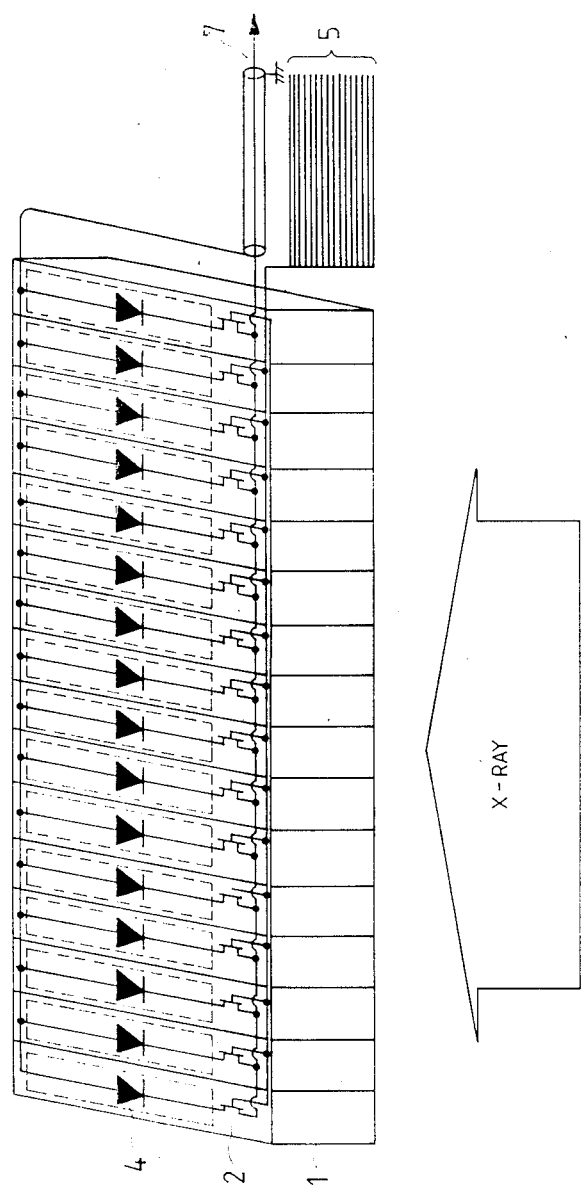
FIGS. 6 and 7A, 7B are a perspective view, a top view and a sectional view showing still another embodiment of the present invention.

Still another embodiments of the present invention is shown in FIGS. 6 and 7. As shown in FIG. 6, the scintillator 1 is divided optically and radiation-wise into 16 units. The X-rays are incident from the lower portion and are converted to fluorescence by the scintillator. Since the X-rays are absorbed substantially completely by the scintillator, they do not penetrate through and come out from the upper surface of the scintillator. The rays of light emitted from the scintillator are converted to an optical current by the photo-diodes consisting of a thin film-like amorphous conductive material (hereinafter referred to as "PD") that is formed on the upper surface of the scintillator. Sixteen PDs 4 are formed in such a manner as to correspond to the 16 divided units of the scintillator. The output signal of each PD is read out appropriately in accordance with ON/OFF of a thin film transistor 2 (hereinafter referred to as "TFT") which is formed in series with each PD on the 1:1 basis. As a result, the output signal of each channel is taken out as a time-series electrical signal by the switching operation of the TFT2. In other words, these TFTs 2 operate as a multiplexor which connects in time series the output signal of each channel to one output line 7. Reference numeral 5 represents a control signal for the ON/OFF control of each TFT.

Next, the structure of one element will be described in detail with reference to FIG. 7B. The scintillator 1 is composed of $Gd_2O_2S$:Pr, Ce, F formed by hot isostatic press and is 1.5 mm thick, for example. Mirror polish is applied to its both surfaces. An Al vacuum deposition film 281 is formed on one of the surfaces of the scintillator as a light reflection film for reflecting fluorescence. It is 0.3 $\mu$m thick, for example. An $SiO_2$ film 22 is formed on the other surface of the scintillator as a transparent protective film. It is 2 $\mu$m thick, for example. $SiN_4$, $Ta_2O_5$, or the like, may be used as the transparent protective film. In a PD portion 4, a transparent electrode such as ITO 23 is formed on the transparent protective film, and p-type, i-type and n-type amorphous silicon (hereinafter referred to as "a-Si") films 25, 26 and 27 are formed sequentially. Here, $SnO_2$ or a two-layered film of ITO/$SnO_2$ may be used in place of ITO. An Al electrode 282, for example, is formed further thereon. A Cr electrode may be used as the electrode.

Next, the TFT portion 2 will be described. An Al electrode 284, for example, is used as the base electrode. This A( film functions also as a light shield film which cuts off emitted rays of light from the scintillator. An $SiO_2$ 242 as an insulation film is formed on the Al layer and an a-Si (i) layer 262 is formed further thereon. Two Al electrodes 282 and 283 are in contact with this a-Si layer from the upper portion. The electrode 282 has a unitary structure with the PD electrode. Reference numerals 243, 244 and 245 represent isolation $SiO_2$ layers, respectively.

Figure 7A:
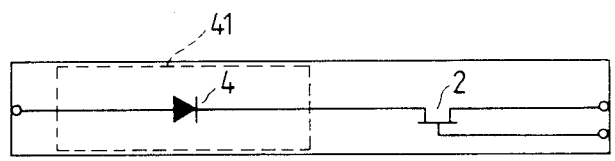
Figure 7B:
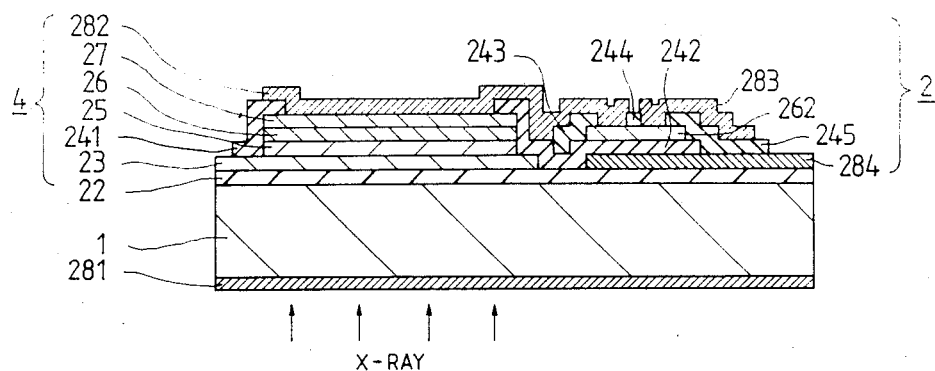

FIG. 7A shows the circuit of this element In the drawing, the formation region 41 of PD 4 is a substantial radiation receiving portion and this portion is preferably as great as possible from the aspect of detection efficiency. As described already, it is very important to pay sufficient consideration so as not to permit the incidence of the scintillator light into the semiconductor layer of the TFT portion.

Figure 8:
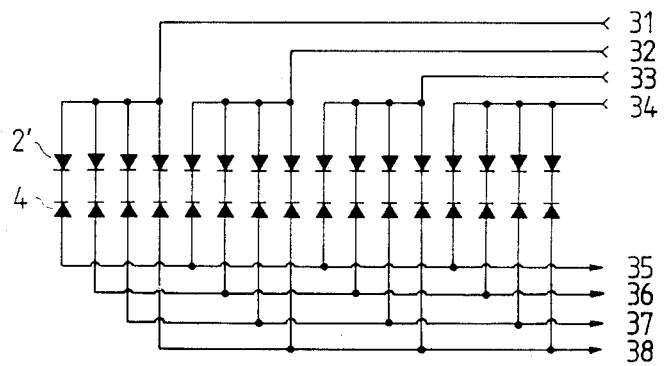
FIGS. 8 and 9A, 9B are a circuit diagram, a top view and a sectional view showing still another embodiment of the present invention.

Still another embodiment of the present invention will be described with reference to FIGS. 8 and 9.

This embodiment is characterized in that the diode 2' is used in place of TFT for switching of each element. FIG. 8 shows only the circuit portion to simplify the illustration and the scintillator of the substrate is omitted. However, in this embodiment, too, sixteen elements are formed as one scintillator block in the same way as in FIG. 6. The principle of operation will be described with reference to FIG. 8. When the scintillator beam due to the incidence of radiation rays is incident to the PD 4, a charge is built up between the isolation diode 2' and the PD 4. If the isolation diode 2' is turned ON at the time of read-out of the signal, the signal charge at this node can be read out. Four isolation diodes 2' as a group are connected to control line 31, 32, 33, 34, respectively. Therefore, four signal lines 35, 36, 37, 38 become necessary for the sixteen PDs 4.

Figure 9A:
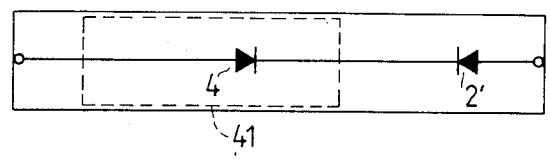
Figure 9B:
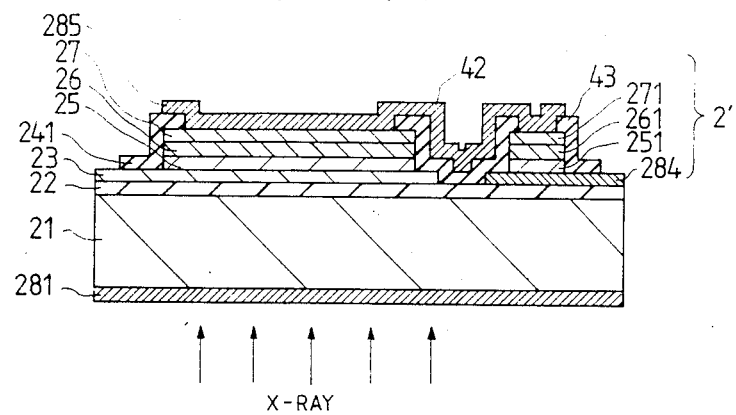

Next, the structure of one element will be described with reference to FIGS. 9A and 9B. The scintillator substrate and the PD portion 4 are the same as those shown in FIG. 7B, and like reference numerals are used to identify like constituents. Therefore, repetition of description is omitted. A Cr electrode 285 as the upper electrode of the PD portion is integrated with the upper surface of the isolation diode 2'. The isolation diode 2' consists of a p-type a-Si layer 251, an n-type s-Si layer 261 and an n-type a-Si layer 271 that are laminated on the Al electrode 284. Reference numerals 42 and 43 represent $SiO_2$ layers for isolation.

In this embodiment, too, an opaque electrode (Al electrode 284) is used for the electrode of the diode portion on the scintillator side so as to prevent an erroneous operation due to the incidence of the emitted rays of light from the scintillator into the diode.

In all of the foregoing embodiments, a-Si is shown used as the photoconductive material However, since the gist of the present invention resides in the direct formation of the photo-diodes or the electronic circuit on the scintillator circuit, it is basically possible to use, as the photoconductive material, other materials such as a chalcogenite material consisting principally of amorphous Se, for example. In such a case, the emission light wavelength of the scintillated must be such that it can be detected by the Se system photo-diodes.

Figure 10:
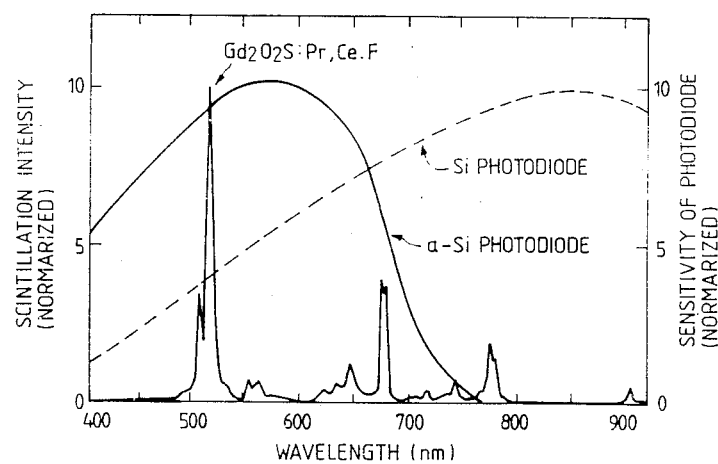
FIG. 10 is a diagram showing scintillation intensity and sensitivity characteristics of a photo-diode.

Next, the relation between the a-Si photo-diode and the emission wavelength of the scintillator will be described with reference to FIG. 10. The optical detection wavelength of ordinary crystalline silicon photo-diodes has a peak between 800 nm and 900 nm but the a-Si photo-diode exhibits its maximum detection sensitivity from 550 nm to 600 nm and has high detection sensitivity to the rays of light of from about 400 nm to about 700 nm. On the other hand, since the main emission of $Gd_2O_2S$:Pr, Ce, F is $\sim$ 510 nm, a-Si PD can detect this emission extremely efficiently. Since $CdWO_4$ has an emission peak at 400 nm $\sim$ 450 nm, it is in good match with the wavelength of the a-Si photo-diode. Other examples of scintillator having the emission wavelength of 400 nm to 700 nm include $BaFBr$:$EuLa_2O_2S$:Tb, LaOBr:Tb, $Gd_2O_2S$:Tb, $Y_2O_2S$:Tb, CsI:Tl, and the like. The afore-mentioned a-Si thin film PD and the thin film circuit can be formed on the transparent substrate containing them.

It is possible to align the spectral sensitivity of the thin film PD as a method of aligning the emission peak and the reception peak. Amorphous silicon a-Si described above is generally prepared by radio frequency glow discharge decomposition of monosilane $SiH_4$, and a-Si prepared by this method generally contains about 10 at% of hydrogen and has an optical gap of about 1.7 to about 1.8 eV. Accordingly, if a diode having a p-i-n junction or a Schottky junction is produced, its spectral sensitivity is such as shown in FIG. 5.

To change this spectral sensitivity, the spectral peak becomes 500 nm if disilane gas is used in place of monosilane and an i-layer film having an optical gap of about 1.8 to about 1.85 eV is used.

When the thin film is formed in the same way by adding methane $CH_4$ to the monosilane gas, an a-SiC thin film containing hydrogen is formed and the peak of spectral sensitivity can be further shifted to the short wavelength side. When C is mixed by about 30%, the spectral peak can be shifted by up to about 500 nm.

The peak of spectral sensitivity can be shifted to the longer wavelength side by mixing a suitable amount of germane $GeH_4$.

The various thin films described above can be formed by various methods such as sputtering, microwave, CVD, optical CVD, vacuum deposition, and so forth.

What is claimed is:

1. In a radiation detection element of the type in which photo-diodes made of an amorphous photoconductive material are formed directly on a substrate consisting of a scintillator, a multi-element type radiation detection element characterized in that a plurality of said photo-diodes are formed on said scintillator substrate while being independent electrically; said scintillator substrate is supported by one support and divided into a plurality of blocks by trenches, said photo-diodes are formed for each of said blocks, a separator sheet made of a material which is opaque either optically or radiation-wise is inserted into each of said trenches between said blocks and said trench has a depth reaching the inside of said support and the tip of said separator sheet reaches the inside of said support.

2. A multi-element type radiation detector comprising:
   a scintillator substrate consisting of a plurality of scintillator blocks that are isolated from one another either optically or radiation-wise and are integrated with one another;
   a plurality of photo-diodes, each being made of an amorphous photoconductive material, formed on the surface of each of said scintillators on said scintillator substrate and converting emission of each of said scintillator to an electrical signal; and
   a plurality of thin film switches, each being formed on the surface of each scintillator of said scintillator substrate and connected to each of said photo-diodes.

3. A multi-element type radiation detector according to claim 2, wherein one of the ends of each of said thin film switches is connected to a common output signal line, and said switch elements function as a multiplexor for connecting on a time division basis the output of each of said photo-diodes to said signal line.

* * * * *